United States Patent

Bozso et al.

[11] Patent Number: 5,760,478
[45] Date of Patent: Jun. 2, 1998

[54] CLOCK SKEW MINIMIZATION SYSTEM AND METHOD FOR INTEGRATED CIRCUITS

[75] Inventors: Ferenc Miklos Bozso, Peekskill, N.Y.; Philip George Emma, Danbury, Conn.

[73] Assignee: International Business Machines Corporation, Armonk, N.Y.

[21] Appl. No.: 700,261

[22] Filed: Aug. 20, 1996

[51] Int. Cl.[6] .......................... H01L 23/48; H01L 23/52; H01L 29/40; H01L 23/02
[52] U.S. Cl. .......................... 257/777; 257/778; 257/685; 257/686; 438/108
[58] Field of Search .......................... 257/780, 778, 257/685, 686, 777, 779, 786; 438/108, 613

[56] References Cited

U.S. PATENT DOCUMENTS

| | | | |
|---|---|---|---|
| 5,164,817 | 11/1992 | Elsenstadt et al. | 307/480 |
| 5,294,837 | 3/1994 | Takase et al. | 257/774 |
| 5,323,060 | 6/1994 | Fogal et al. | 257/777 |
| 5,331,235 | 7/1994 | Chun | 257/777 |
| 5,362,986 | 11/1994 | Angiulli et al. | 257/723 |
| 5,382,832 | 1/1995 | Buti et al. | 257/773 |
| 5,399,898 | 3/1995 | Rostoker | 257/499 |
| 5,432,729 | 7/1995 | Carson et al. | 365/63 |
| 5,434,453 | 7/1995 | Yamamoto et al. | 257/777 |
| 5,565,816 | 10/1996 | Coteus | 331/2 |

FOREIGN PATENT DOCUMENTS

| | | | |
|---|---|---|---|
| 60-175444 | 9/1985 | Japan | 257/780 |
| 2-126685 | 5/1990 | Japan | 257/777 |
| 4-116859 | 4/1992 | Japan | 257/686 |
| 4-346463 | 12/1992 | Japan | 257/659 |
| 5-129516 | 5/1993 | Japan | 257/777 |

OTHER PUBLICATIONS

H.W. Gruber et al, "Compact Stacked Memory Package", 2/88, v. 30, pp. 428–429, IBM Technical Disclosure Bulletin.

*Primary Examiner*—Mahshid D. Saadat
*Assistant Examiner*—Jhihan B. Clark
*Attorney, Agent, or Firm*—Robert P. Tassinari, Jr.

[57] ABSTRACT

A precise and highly controllable clock-distribution network is provided on one active substrate to distribute clock signals with minimal skew to another active substrate by connecting the substrates together face-to-face using flip-chip technology. Since the clock-distribution substrate is sparse, "quiet busses" are provided on the sparse substrate to facilitate the high-speed transfer of data over relatively long distances. Low-power devices (e.g., DRAM) can be provided on one substrate for use by higher-power logic (e.g., a processor) on another substrate with minimal interconnection distance.

21 Claims, 8 Drawing Sheets

TRENCH CUT INTO TERTIARY SUBSTRATE
TO ACCOMODATE PRIMARY SUBSTRATE

CLOCK SKEW MINIMIZATION SYSTEM AND METHOD FOR INTEGRATED CIRCUITS

The invention relates to integrated circuit packaging, and in particular to a packaging system and method for minimizing clock skew in integrated circuits.

Figure 1:
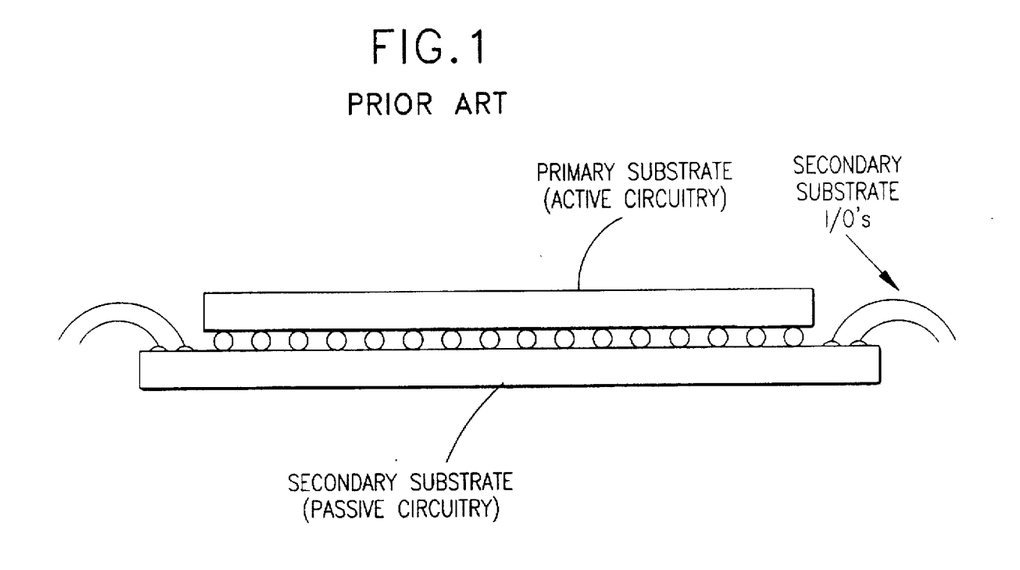
FIG. 1 shows a primary substrate C4-bonded to a secondary substrate.

Flip-Chip technology, sometimes called Controlled Collapse Chip Connection (C4) technology, is well established, and is used pervasively to connect chips to second-level packages (substrates). Basically, the technology involves placing solder-balls on a chip's I/O pads, inverting the chip, and soldering it to a substrate having the same pattern of pads so as to effect interconnection between the chip and the substrate. An example of a product of this type is shown schematically in FIG. 1. For a discussion of solderball and C4 technology, see R. Tummala and E. Rymaszewski, *Microelectronics Packaging Handbook*, Von Nostrand Reinhold, 1989; "Solder Ball Connect Technology", IBM J. of Res. and Dev., Vol. 37, No. 5, Sept. 1993, pp. 581–676.

Historically, the substrate has merely been a second-level package (that is, a passive object having wiring levels). Such substrates have been ceramic, glass-ceramic, or even silicon. The purpose of the substrate has been merely to provide a wiring means between chips on the substrate.

A processor comprises latches (that hold the "state" of the system) and logic that operates on the current state together with extraneous inputs to "compute" the next state of the system. Ideally, the clock affects all latches exactly simultaneously so that the transition to this new computed state is complete and instantaneous.

In reality, the clock cannot possibly hit every latch at exactly the same time, so not all of the latches switch at exactly the same time. If the output of a first latch affects the input to a second latch (either directly, or through logic circuitry), and the instant at which the clock arrives at the second latch relative to the instant at which the clock arrives at the first latch is uncertain by an amount $(\pm)X$, then the nominal cycle time (worst case delay path in the machine) must be increased by X to allow for the possibility that the second latch will capture data at a time that is X too early. In fact nominal cycle time must be increased by 2X, because the first latch could have captured the relevant data at a time that is X later than assumed. This is one performance impact of clock skew, which is a factor that is added to the nominal cycle time of a processor to account for the uncertainty associated with the arrival of the clock signal to different parts of a processor. The clock signal is a primary input to a chip. It is an oscillator pulse. In a real central processor ("CP") chip, there typically are tens of thousands of latches that are gated by this clock. If the fanout of a typical gate is f, and there are n latches, then there must be log(base f) (n) intermediate stages of drivers between the original clock pulse (the primary input to the chip) and any latch that is gated by that clock. In a real system, there might be as many as ten levels.

As those levels of redrive are implemented in a fanout tree, there are asymmetries, since the various branches of the tree are different distances from the source, and do not drive exactly the same number of latches. That is, the wire-lengths are different, and the loads are different. These are the major contributors to clock skew, and this is a bigger problem as cycle-times get faster.

Since most of the silicon area in a microprocessor is active, the intermediate levels of redrive cannot be placed in ideal positions; instead they are placed wherever there is "white space". This contributes to the asymmetry.

In the custom design of a complex microprocessor, the silicon surface cannot be "peppered" with clock redriving stages in a regular pattern. A regular "peppering" of clock driver circuits would interfere with the physical dataflow of the logic circuits, and this would hurt cycle time. That is, reducing skew is hard, and it is impossible to render it ignorable in any real 1-chip processor.

It is an object of the present invention to provide a precise and highly controllable clock-distribution network on one active substrate, henceforth referred to as a secondary substrate (or chip), and to distribute clock signals through the network with minimal skew to another active substrate, henceforth referred to as a primary substrate (or chip), using C4 technology. Note that in general, the primary substrate is densely populated and dissipates lots of power, and the secondary substrate is sparsely populated and dissipates significantly less power.

It is a further object of this invention to provide "quiet busses" on the sparsely-populated secondary substrate to facilitate the high-speed transfer of data to points on the primary substrate.

It is a further object of this invention to provide other low-power peripheral hardware (e.g., DRAM) on the secondary substrate for use by higher-power logic (e.g., a processor) on the primary substrate.

It is a further object of this invention to provide tertiary (and higher-order) substrates via this same C4 technology.

In accordance with one aspect of the present invention two active chips (i.e., both containing active circuitry) are bonded together. Doing this has two preconditions:

1. The sum of the heat generated by all chips is no greater than can be removed.
2. The chips are different sizes, or are bonded while offset from each other. This provides the advantage of making I/O pads accessible for off-chip connection with the connecting means of other packages. If the chips are the same size, and they are aligned and bonded face-to-face, then no I/O pads would be accessible. If a small chip is bonded to a larger chip, or if chips of the same size are bonded together with an offset, then portions of the chip surfaces are accessible for wire-bonding to another substrate. In fact, the pads on the larger of the two chips can be bonded to a third, even-larger substrate using the same C4 technology if a trench is provided in the third surface to receive the smallest chip.

A further aspect of the invention is the bonding of a dense and complex logic chip that can dissipate a significant amount of power (e.g., a microprocessor) to a sparsely populated active chip that dissipates significantly less power.

The sparsely-populated secondary chip can be used: to distribute clock signals in an extremely controlled manner; as a quiet medium for long busses that can be operated at higher speed in the quiet environment than they could on the surface of the primary chip; and, for optional low-power devices of other types (e.g., DRAM). This is useful because it affords higher performance communication and better skew-control at the system level, and it results in a cheaper package.

The invention will be explained with reference to the following figures, in which.

In existing single-chip microprocessor systems, the clock-distribution network is embedded in the processor chip itself. By contrast, in systems in accordance with this invention, the primary substrate can be a microprocessor chip without a clock-distribution network, and a having a clock distribution network provided on a secondary substrate. Note that the circuitry, and therefore the power, associated with the two systems is the same, i.e., this invention does not inherently create power or cooling problems.

Further, if there is nothing on the secondary substrate except for the clock-distribution network, then the active area of the secondary substrate is extremely sparse, and the redriving nodes of the clock-tree can be placed ideally. Specifically, the redriving stages are placed in symmetric locations, and all wire-lengths and loads are identical throughout the tree. As was previously explained, this would not be possible in any real microprocessor chip having a clock-distribution network that is integral to the microprocessor chip.

In this invention, the primary substrate which is densely populated (e.g., a microprocessor) is conceptually divided into a large number of square "tiles" (e.g., 1 mm×1 mm or smaller), and a clock I/O pad is placed in the center of each tile. All latches within the tile are driven by the clock pad in the center of the tile. Such a configuration is shown on FIG. 2.

Figure 2:
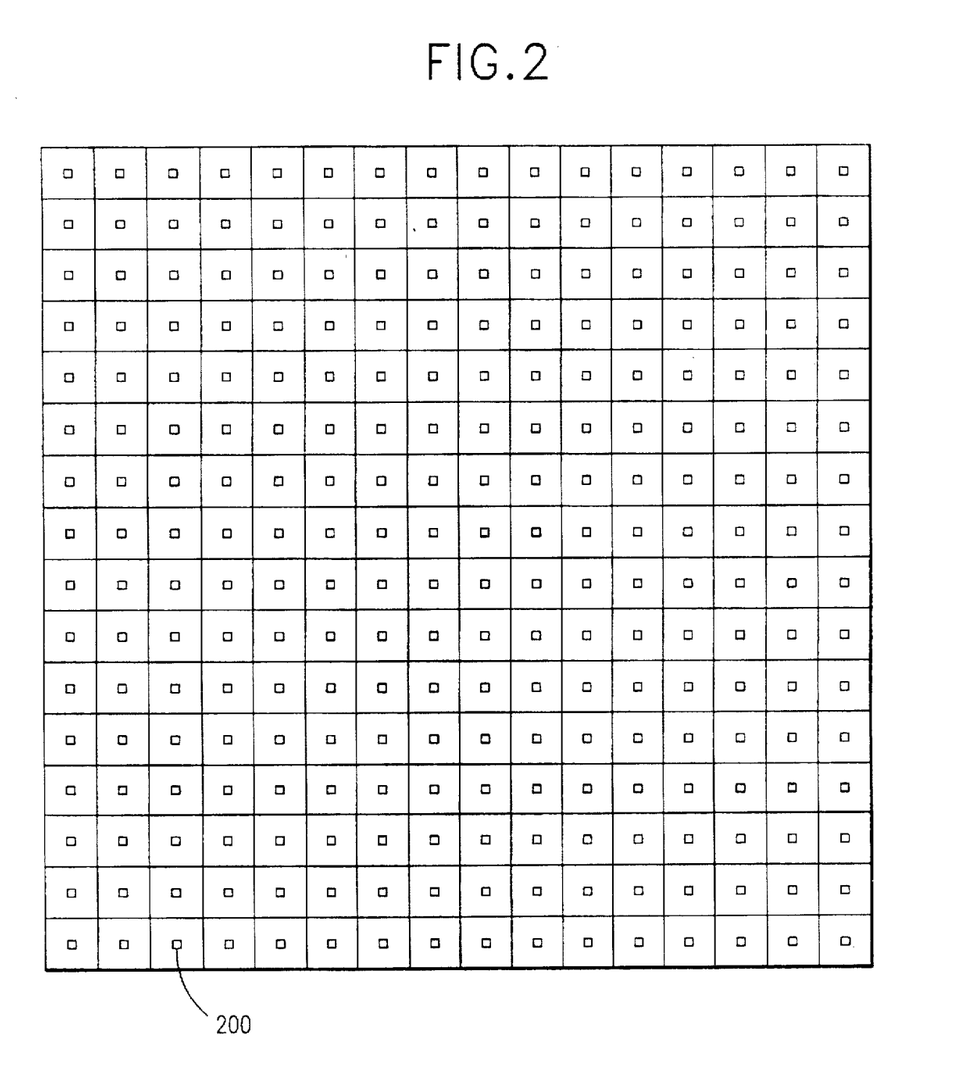
FIG. 2 shows a 16 mm×16 mm chip partitioned into 256 square tiles, each with an I/O pad in the center.

Specifically, FIG. 2 shows a 16 mm×16 mm chip that is partitioned into 16×16 tiles, where each tile is a 1 mm×1 mm square. An I/O pad 200 is shown in the center of each tile. This I/O pad is a local clock-input pad, and it drives all latches within its tile. The worst-case Manhattan distance from an I/O pad to a latch is 1 mm in this figure.

The clock inputs to these I/O pads are provided through solder-ball connections to identically positioned I/O pads on the secondary substrate, which contains the clock distribution circuitry for the primary chip logic. Because of the sparsity of the clock-distribution network on the secondary substrate, the simultaneous arrival of a primary clock signal to all driver pads on the secondary substrate, hence to all tiles on the primary substrate, can be guaranteed to within an extremely small tolerance. This would not be possible in existing microprocessors having integral clock-distribution networks.

Furthermore, since the circuitry on the secondary substrate is extremely sparse, clock-trimming and calibrating circuitry can also be embedded in the clock-distribution network for even better skew control. Thus, the invention simplifies the clock distribution design while improving cycle time via eliminating skew.

Figure 3:
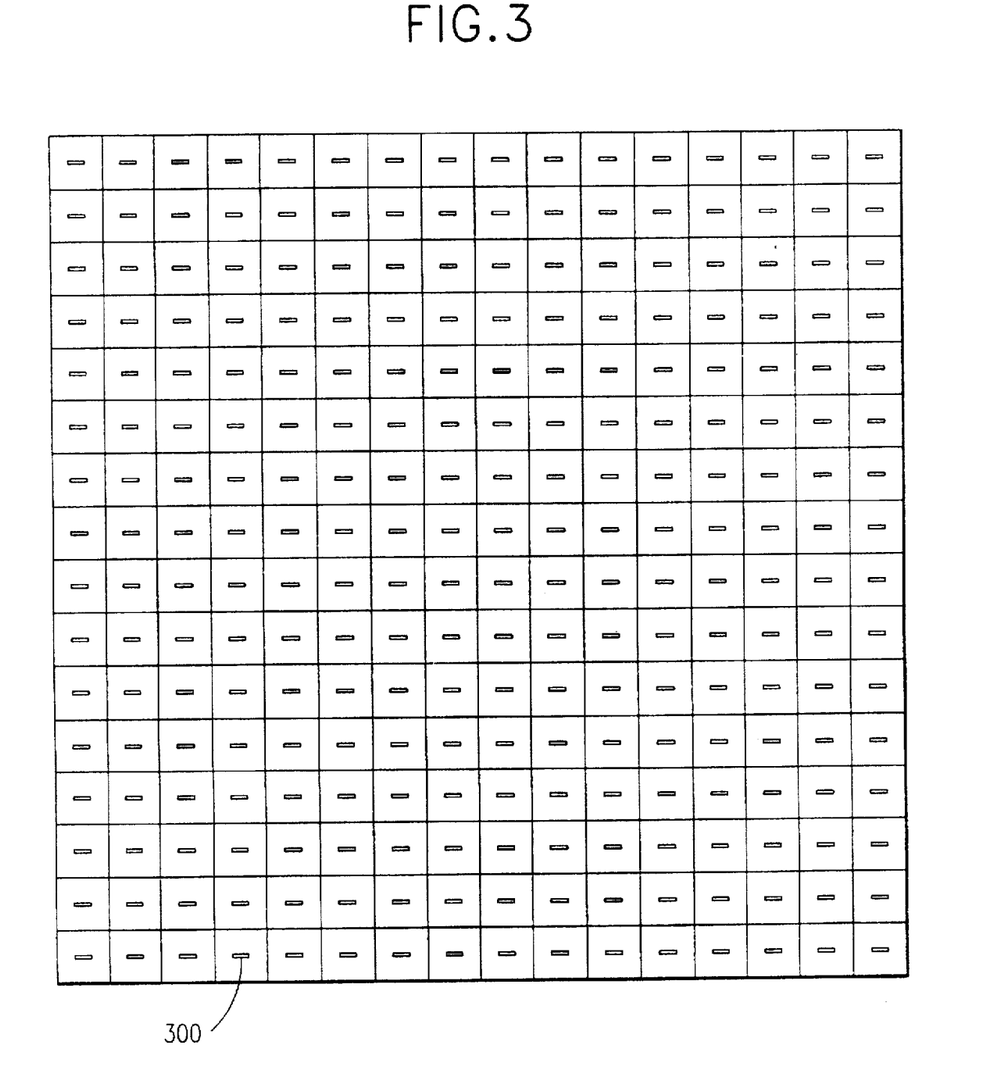
FIG. 3 shows a clock driving and calibrating circuitry for 256 tiles on a 16 mm×16 mm grid.

For example, FIG. 3 shows 50 µm×400 µm rectangles 300 within the tiles of a 16 mm×16 mm chip area. These rectangles represent the area required for clock-trimming and calibrating circuitry associated with each tile. The circuitry in these rectangles is more than adequate for providing very robust clock trimming and calibration, and it is clear from the figure that the area involved is trivial.

Figure 4:
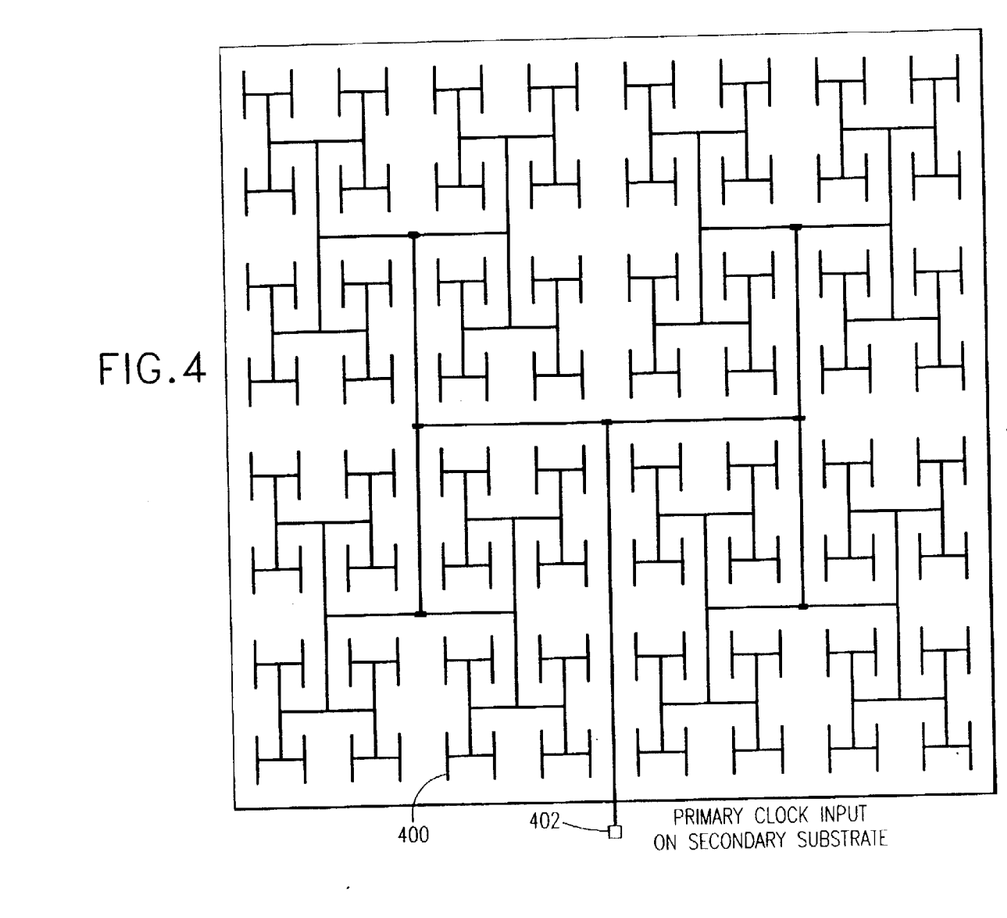
FIG. 4 shows a symmetrical wiring scheme for a clock network implemented as a binary tree.

FIG. 4 shows a preferred wiring layout of the clock tree on the secondary substrate configured in the form of a binary tree. Note that the distance to each leaf node 400 from the primary clock input 402 is exactly the same, and the load fanning out in each direction from each fanout node is exactly the same. Located at each leaf node is a driver circuit (not shown) for driving the output pin at the leaf node.

The clock trimming circuit (or controlling means) contains scan-only control latches whose states cause the circuit to move clock edges back relative to the reference (input clock) signal prior to fanning the clock signal out. Each tile in FIG. 3 has its own state control latches and all of these latches are connected in a single scan ring on the secondary substrate. Clock skew can further be controlled in accordance with this invention via probing the transmitted clock signals on the primary (or secondary) substrates, and then adjusting clock edges via the scan ring. This is a standard technique.

Figure 9:
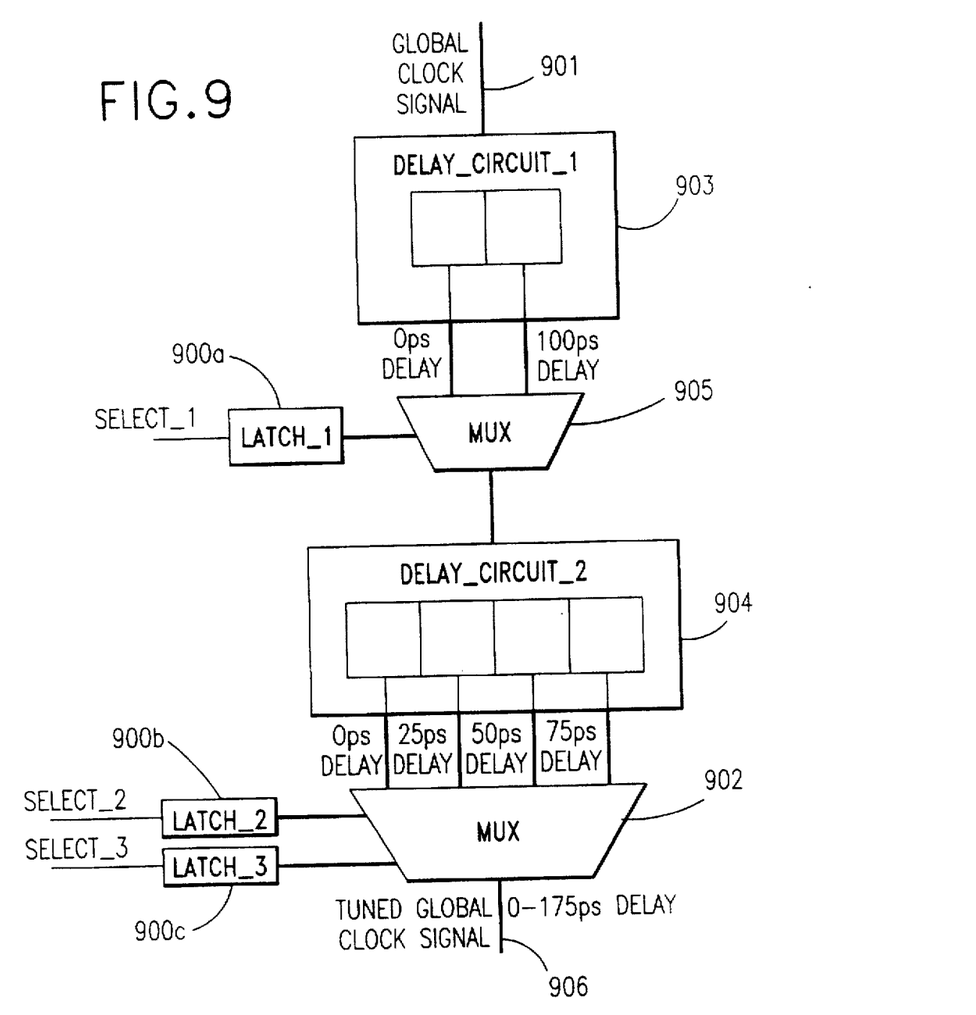
FIG. 9 shows a clock trimming circuit, which delays the clock signal by fixed amounts of time.

The circuit of FIG. 9 operates as follows. A global clock signal to be shifted arrives at trimming circuit of FIG. 9 at the input 901 of a course delay circuit 903. The course delay circuit comprises delay elements that delay the input signal by 100 ps. A multiplexer 905 selects either the delayed or undelayed signal as controlled by control latch 900a. The output of the multiplexer 905 is provided to a fine delay circuit 904 which also comprises delay elements for delaying the signal in increments of 25 ps. A multiplexer 902 selects the desired output signal as controlled by control latches 900b and 900c. The output of the multiplexer 902 is a delayed version of the signal originally input to circuit 904 delayed by an integral multiple of 25 ps.

Another feature of the present invention that is enabled via having a second substrate that is sparse, is a "quiet bus" that can be used on the secondary substrate. This quiet-bus technique can not be done on the primary substrate because the metal levels on that substrate are heavily utilized, and the ambient noise is too great for the technique to work.

In particular, since the clock-distribution network requires only a trivial portion of the available wiring channels, most wiring channels on the secondary substrate (including perhaps several entire metal levels) can be grounded so as to provide a highly-shielded (quiet) environment for the few signals that are actually run across the secondary substrate.

Figure 5:
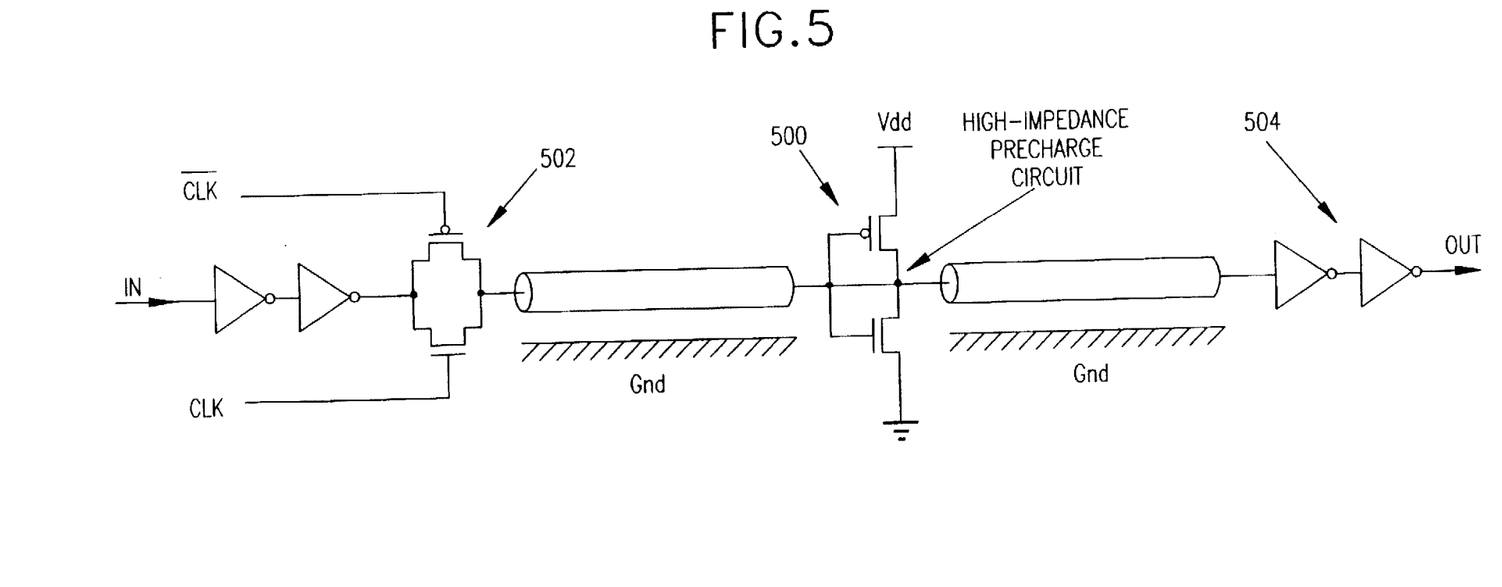
FIG. 5 shows a wire on a quiet bus in accordance with the invention.

FIG. 5 shows a signal wire on the quiet bus. Because the environment is very quiet, the wire can be precharged to an intermediate voltage level via a very-high-impedance precharging circuit 500. This precharging circuit leaks constantly, but the high impedance keeps the leakage low. This circuit could not be used in a noisy environment, because coupled noise could fairly easily pull the precharged circuit in either direction at random.

The input to the wire is a clocked passgate 502 that takes a short sample of the static input, and allows that small sample to pull the precharged bus rapidly in the appropriate direction before allowing the bus to reach a quiescent point near its precharged state. This results in a travelling wave whose velocity is related to the characteristic impedance of the wire. The signal reaches the far end much faster than it would take for any driver circuit to charge the wire, which would be the standard transmission means in a noisy environment. The small-signal pulse is converted into a static signal by a standard driver 504 at the far end.

Other low power circuits can be located on the secondary substrate where space permits, provided that they do not create a noisy environment around any quiet busses. More and more, systems are being proposed in which a processor chip has a private DRAM that acts like a large L2 cache. In these systems, the microprocessor and the L2 are distinct chips that are mounted on a MultiChip Module (MCM) in close proximity.

If the two chips are adjacent one another, the worst-case signal travel distance is roughly three chip "pitches" (three sides of a chip), and can possibly be managed down to two chip pitches with efficient design.

However, if the L2 is DRAM, then the standby power is typically very low, and in accordance with this invention, the DRAM can be integral to the secondary substrate, and bonded directly onto the CP chip without causing a cooling problem. The worst-case distance in this scenario is determined by two chip pitches, and can possibly be managed down to below one chip pitch with efficient design.

This technique improves system performance by reducing the Finite Cache Effect. (The "Finite Cache" contribution to the "Cycles Per Instruction" (CPI) performance measure for a processor is the product of the miss rate (misses per instruction) of the on-chip cache and the miss penalty (cycles per miss) associated with accessing the off-chip memory hierarchy. One component of this miss penalty is the delay incurred by going from the CP chip to the L2, and back.) It also potentially reduces a multicycle delays to a single cycle, which improves pipelining and has second-order performance benefits.

Figure 6:
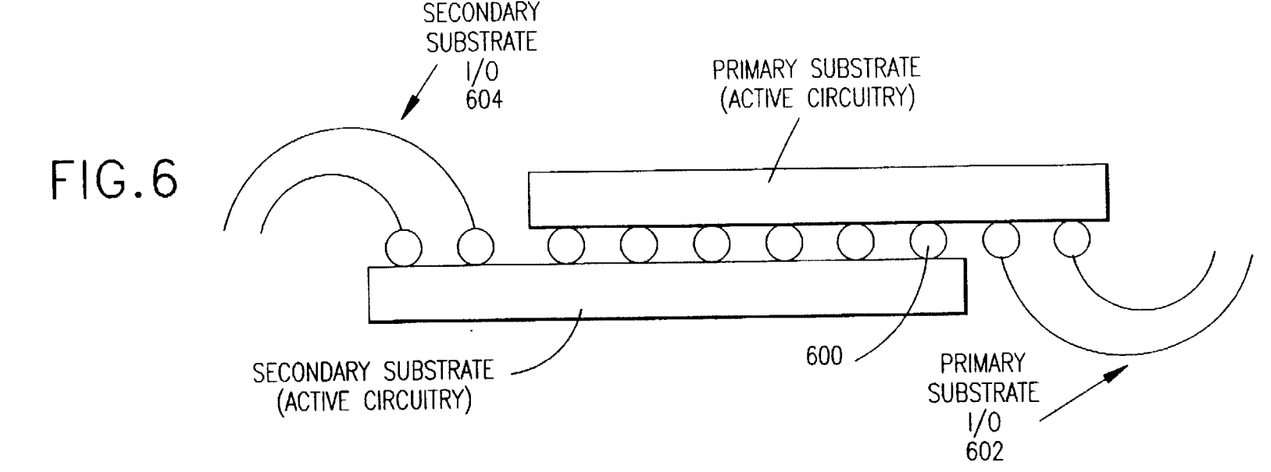
FIG. 6 shows a first embodiment of a primary and secondary package configured in accordance with the invention.
Figure 7:
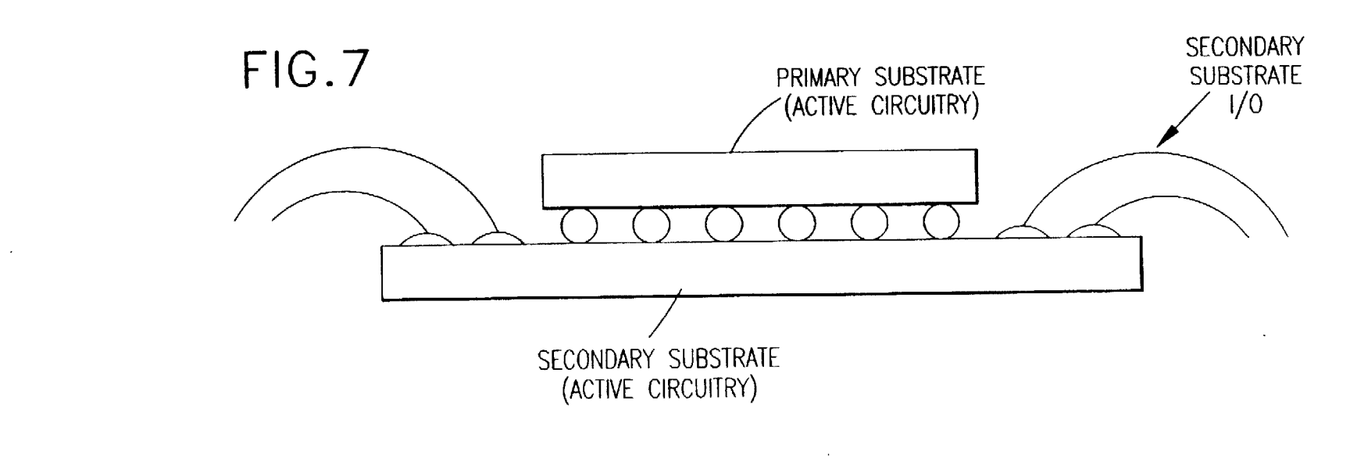
FIG. 7 shows a second embodiment of a primary and secondary package configured in accordance with the invention.
Figure 8:
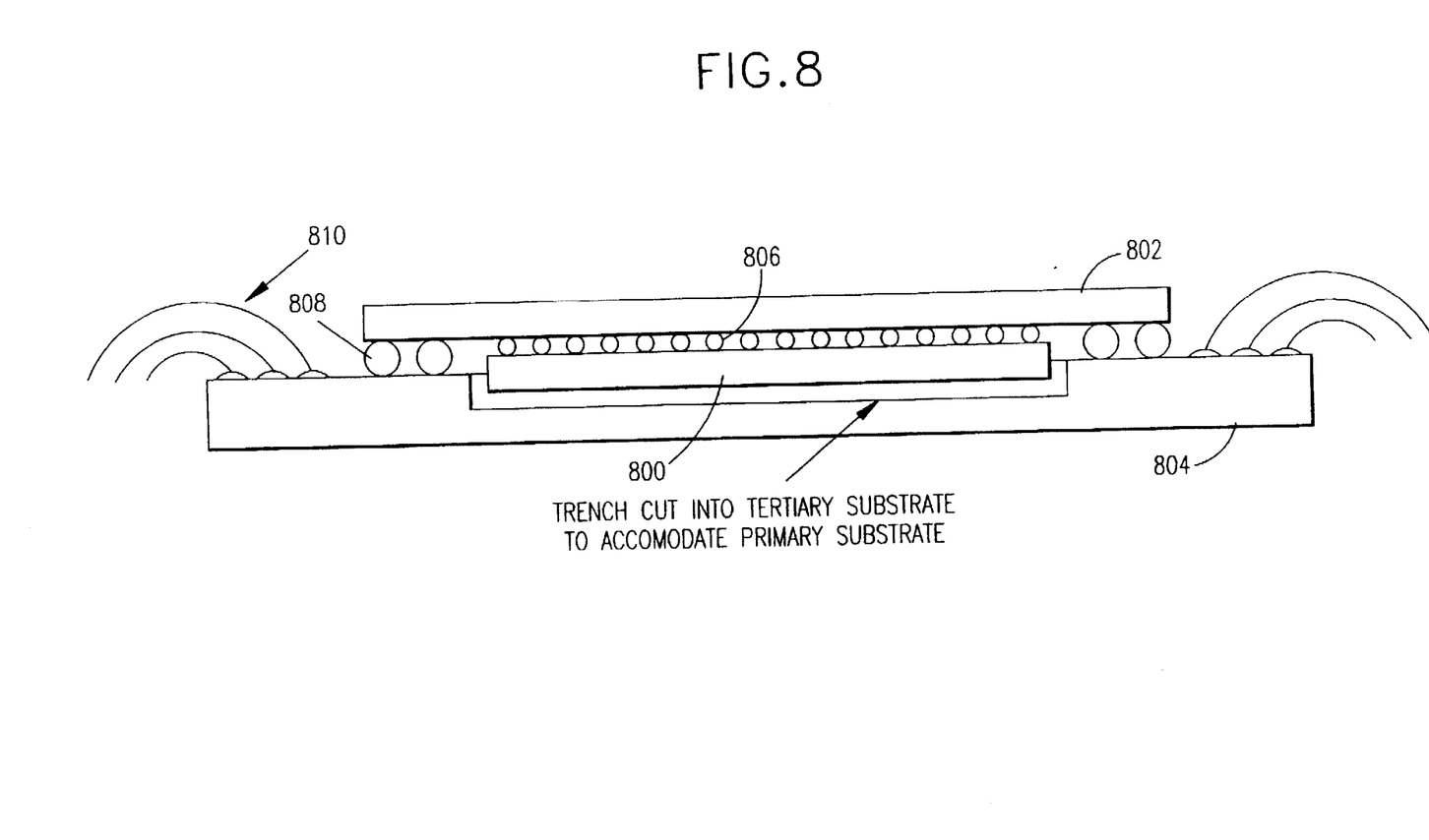
FIG. 8 shows a primary, secondary and tertiary chip bonded in accordance with the present invention.

FIGS. 6–8 show various embodiments in accordance with the invention.

In FIG. 6, the primary and secondary substrates are of comparable size, but are coupled via solderballs 600 in an offset manner so as to expose I/O pins 602 of the primary substrate and I/O pins 604 of the secondary substrate for external connection. As discussed above, both the primary and secondary substrates carry active circuitry.

In FIG. 6, the primary substrate is somewhat smaller than the secondary substrate, so as to expose I/O pins of the secondary substrate for external connection. Again, both the primary and secondary substrates carry active circuitry.

The invention can be extended to include a tertiary (and further) substrates as well, as shown in FIG. 8. The embodiment of FIG. 8 includes a primary substrate 800, secondary substrate 802 and tertiary substrate 804. The primary and secondary substrates are bonded together by solder balls 806, positioned at corresponding I/O pads. External I/O pads 808 from the secondary substrate are bonded to pads on the tertiary substrate using the same C4 (flip-chip) technology. In order to facilitate this connection, a trench can be provided in the tertiary substrate to accommodate the primary substrate. External I/O pins 810 of the tertiary substrate are exposed for external connection.

Another benefit afforded by this invention is that it results in a less expensive package. In the processor/DRAM case, a multichip-module (second level package) is required using prior technology, and such second-level packaging requires an area that is proportional to two chips that the third-level package (e.g., card) must accommodate.

In the processor/DRAM system that is made in accordance with this invention, there is no second-level package per se, since the DRAM secondary substrate is the "carrier" for the processor primary substrate. That processor/DRAM single-package entity can be wire-bonded or C4-bonded to the third-level package directly, and the area required is only proportional to the area of the secondary substrate (i.e., to the area of a single chip). The same third-level package that is used in such systems today could accommodate twice as many systems made in accordance with this invention.

While the invention has been described in particular with respect to preferred embodiments thereof, it will be understood that modifications to the disclosed embodiments can be effected without departing from the spirit and scope of the invention as defined by the following claims.

Having thus described our invention, what we claim as new, and desire to secure by Letters Patent is:

1. A system comprising a primary chip and a secondary chip each having active components, said primary chip and secondary chip being connected to each other face-to-face so that I/O pads on at least the secondary chip remain accessible to connection means outside of the system, wherein one of said primary and secondary chips contains logic circuitry, and wherein the other chip contains a clock distribution network for delivering clock signals to the logic circuitry on the one chip via a plurality of connection points between the faces of the primary and secondary chips.

2. The system in accordance with claim 1, wherein the primary and secondary chips are coupled via solderballs.

3. The system in accordance with claim 1, wherein the face of the primary chip has a smaller area than the face of the secondary chip.

4. The system in accordance with claim 1, wherein the primary and secondary chips are connected face-to-face in an offset manner.

5. The system in accordance with claim 1 in which said secondary chip contains said clock distribution network, and wherein said clock distribution network is a fanout tree with leaf nodes placed on a regular grid, each said leaf node containing an I/O driver circuit, each said I/O driver circuit driving an I/O pad centered at points on the grid corresponding to said leaf nodes, each said I/O pad being connected to a corresponding I/O pad on the primary chip, each said I/O pad on said primary chip serving as a clock input, each said clock input being used to gate storage elements that are proximate and coupled to that input.

6. The system in accordance with claim 1, wherein at least one of said primary and secondary chips contain inactive regions and regions of unused wiring tracks on one or more metal wiring levels in which a plurality of wires in said wiring tracks are connected to a common ground so that some wires in said wiring tracks are shielded by said grounded wires and wherein said one of said chips acts as a waveguide for signal transmission between points on the other of said chips.

7. The system in accordance with claim 1 in which said secondary chip contains DRAM.

8. The system of claim 1, further comprising a second primary chip, wherein each said primary chip is connected to the secondary chip face-to-face so that I/O pads on at least the secondary chip remain accessible to connection means outside of the system of chips.

9. The system in accordance with claim 5 in which at least one of said I/O driver circuits further contains a controlling means for delaying the clock input by fixed amounts of time.

10. The system in accordance with claim 9 in which said controlling means stores state information that specifies one of several fixed amounts of time, said state information being retained by storage means settable by a scan operation.

11. The system in accordance with claim 10 further comprising transmitting means including an active high-impedance precharging circuit and a circuit that gates an input signal onto the sending end of a wire, said precharging circuit holding the voltage of the wire at a level that is intermediate to logic levels 0 and 1, said gating circuit being periodically opened and closed by a clock pulse to sample said input signal to enable said transmitting means to transmit signal pulses in a quiet environment in accordance with the state of said input signal.

12. The system in accordance with claim 6 in which said shielded wires are used for transmitting data signals.

13. The system of claim 6, wherein said secondary chip contains said shielded wiring tracks.

14. The system in accordance with claim 13 wherein said shielded wiring tracks are used for transmitting signals.

15. The system in accordance with claim 14 further comprising transmitting means including an active high-impedance precharging circuit and a circuit that gates an input signal onto the sending end of a wire, said precharging circuit holding the voltage of the wire at a level that is intermediate to logic levels 0 and 1, said gating circuit being periodically opened and closed by a clock pulse to sample said input signal to enable said transmitting means to transmit small-signal pulses in a quiet environment in accordance with the state of said input signal.

16. The system in accordance with claim 15 in which said transmitting means is used to transmit signals between elements on the said primary chip.

17. A system of hierarchically connected chips having more than three levels in the hierarchy, wherein in each level in the hierarchy, the chip at each said level has a trench for receiving subsystems of lower-level hierarchies, and wherein the chip at the highest level of each said lower-level hierarchy is connected to the chip of said level face-to-face so that some I/O pads of the chip of the said level are accessible to connection means above the level of the hierarchy.

18. An active integrated circuit chip comprising inactive regions and regions of unused wiring tracks on one or more metal wiring levels in which a plurality of wires in the wiring tracks are connected to a common ground so that some wires in the wiring tracks are shielded by the grounded wiring tracks, the shielded wires acting as waveguides for signal transmission on said chip.

19. A system comprising a primary chip and a secondary chip each having active components, said primary chip and secondary chip being connected to each other face-to-face so that I/O pads on at least the secondary chip remain accessible to connection means outside of the system, wherein at least one of said primary and secondary chips contains inactive regions and regions of unused wiring tracks on one or more metal wiring levels, wherein a plurality of wires in said wiring tracks are connected to a common ground so that some wires in said wiring tracks are shielded by said grounded wires, and wherein said one of said chips acts as a waveguide for signal transmission between points on the other of said chips.

20. A system comprising a primary chip and a secondary chip each having active components, said primary chip and secondary chip being connected to each other face-to-face so that I/O pads on at least the secondary chip remain accessible to connection means outside of the system, the system further comprising a tertiary chip having a trench for receiving the primary chip, and wherein the secondary chip is connected to the tertiary chip face-to-face so that I/O pads on said tertiary chip remain accessible to connection means outside of the system.

21. A system comprising a first primary chip, a second primary chip and a secondary chip each having active components, each said primary chip being connected face to face with the secondary chip so that I/O pads on at least the secondary chip remain accessible to connection means outside of the system; the system further comprising a tertiary chip having a trench for receiving each said primary chip, wherein the secondary chip is connected to the tertiary chip face-to-face so that I/O pads on said tertiary chip remain accessible to connection means outside of the system.

* * * * *